United States Patent [19]

Yamazaki

[11] Patent Number: 4,588,610
[45] Date of Patent: May 13, 1986

[54] PHOTO-CHEMICAL VAPOR DEPOSITION OF SILICON NITRIDE FILM

[75] Inventor: Shunpei Yamazaki, Tokyo, Japan
[73] Assignee: Semiconductor Energy Laboratory Co., Ltd., Tokyo, Japan
[21] Appl. No.: 613,612
[22] Filed: May 24, 1984
[30] Foreign Application Priority Data May 24, 1983 [JP] Japan .................. 58-91278

[51] Int. Cl.⁴ .................................. B05D 3/06
[52] U.S. Cl. ................... 427/54.1; 427/94
[58] Field of Search .......... 427/53.1, 54.1, 94

[56] References Cited

U.S. PATENT DOCUMENTS 3,798,061  3/1974  Yamazaki .................. 427/54.1
4,363,828 12/1982  Brodsky et al. ............. 427/86
4,435,445  3/1984  Allred et al. .............. 427/54.1

OTHER PUBLICATIONS

Phillips, "Chem. Abstracts" vol. 70 (1969), p. 362, #101099q.

Primary Examiner—John H. Newsome
Attorney, Agent, or Firm—Murray, Whisenhunt and Ferguson

[57] ABSTRACT

A photo-chemical vapor deposition of a silicon nitride ($Si_3N_4$) film which includes the step of irradiating a gas mixture of monosilane (or polysilane) and ammonia ($NH_3$) or hydrazine ($N_2H_4$) gas but without mercury vapor by ultraviolet light having a wavelength of 200 nm (or 300 nm) or less to deposit the silicon nitride ($Si_3N_4$) film having a charge density of $1 \times 10^{11}$ cm$^{-2}$ or less on a substrate held at 100°–500° C. in a reaction chamber held under a pressure of 0.1 to 10 Torr.

7 Claims, 1 Drawing Figure

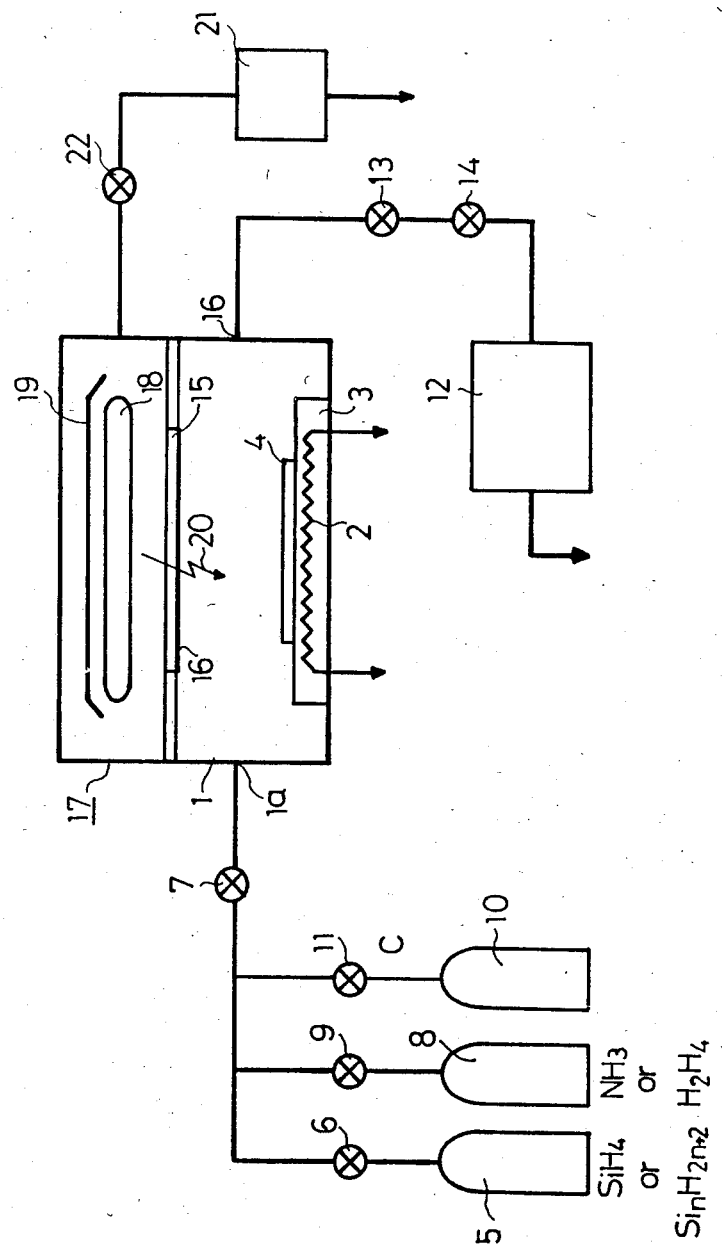

PHOTO-CHEMICAL VAPOR DEPOSITION OF SILICON NITRIDE FILM

BACKGROUND OF THE INVENTION

1. Field of the invention

The present invention relates to improvement in a silicon nitride film deposition method, and more particularly to a method of depositing, by a photo-CVD (Chemical Vapor Deposition) technique, a silicon nitride expressed by $Si_3N_{4-x}$ (where $0 \leq X < 4$) on a substrate.

2. Description of the prior Art

In semiconductor devices, a silicon nitride film deposited on a substrate is widely used as a dielectric thin film, insulating film or the like. In a semiconductor manufacturing process, a silicon nitride deposited on a substrate is widely employed as an impurity diffusion mask, etching mask or the like.

Conventionally, a plasma-CVD technique, a photo-CVD technique and so forth have been proposed for such silicon nitride film deposition on a substrate.

With the plasma-CVD technique, the silicon nitride film can be deposited on the substrate in a relatively low-temperature atmosphere without heating the substrate to high temperatures and consequently without inflicting thermal damages to the substrate. Therefore even if the substrate is a semiconductor substrate that has formed thereon a semiconductor element or interconnect structure, the semiconductor substrate and the interconnect structure are free from thermal damages. Accordingly, the plasma-CVD technique is suitable for use in semiconductor device fabrication including silicon nitride film deposition on a semiconductor substrate.

In the silicon nitride film deposition by the plasma-CVD technique, however, a plasma causes radiation induced damages to the deposited silicon nitride film or the underlying substrate due to the plasma bombardment thereof.

On the other hand, a photo-CVD technique also permits the silicon nitride film deposition on the substrate without the necessity of heating it to high temperatures, as is the case with the plasma-CVD technique. Therefore, this technique is also suitable for use in the semiconductor device fabrication including the silicon nitride film deposition on the substrate.

The photo-CVD technique utilizes light, and hence does not inflict the abovesaid damages to the deposited silicon nitride film or the underlying substrate.

With the conventional photo-CVD technique, a source gas is a gas mixture of monosilane ($SiH_4$) and ammonia ($NH_3$) gases and containing mercury vapor as a photo-sensitizer, and 254 nm ultraviolet light from a mercury lamp is used light irradiation.

Such a prior art photo-CVD method permits more effective optical excitation of the source gas for more effective chemical reaction thereof than in the case of the source gas containing no mercury vapor as a photo-sensitizer, ensuring the silicon nitride film deposition at a practically acceptable deposition rate.

However, the conventional photo-CVD technique presents a problem as its source gas contains the mercury vapor which pollutes the silicon nitride depositing device and its surroundings and damages workers' health.

SUMMARY OF THE INVENTION

It is therefore an object of the present invention to provide a novel method for silicon nitride film deposition on a substrate through the photo-CVD technique but without encountering the abovesaid defects of the prior art.

According to silicon nitride film deposition method of the present invention through using a first photo-CVD technique, a gas mixture of monosilane ($SiH_4$) gas and ammonia ($NH_3$) or hydrazine ($N_2H_4$) gas but without containing mercury vapor is used as the source gas, and ultraviolet light which has a wavelength of 200 nm or less, preferably, 185 nm ultraviolet light from a mercury lamp, is utilized for light irradiation.

According to silicon nitride film deposition method of the present invention through using a second photo-CVD technique, the source gas is a gas mixture of polysilane gas expressed by $SiH_{2n+2}$ (where $n \geq 2$) and ammonia ($NH_3$) or hydrazine ($N_2H_4$) gas but without mercury vapor, and the light for irradiation is ultraviolet light having a wavelength of 300 nm or less, preferably, 254 nm ultraviolet light from a mercury lamp.

With either of the silicon nitride film deposition methods of the present invention employing the first and second photo-CVD technique, it is possible to obtain the same advantages as are obtainable with the deposition method utilizing the abovementioned conventional photo-CVD technique which combines the monosilane/ammonia gas mixture containing mercury vapor with the 254 nm ultraviolet light, but since the source gas does not contain the mercury vapor, the methods of the present invention are free from the drawbacks of the prior art.

BRIEF DESCRIPTION OF THE DRAWING

The accompanying drawing is a schematic diagram illustrating an embodiment of the silicon nitride film deposition method of the present invention and a specific example of the arrangement therefor.

DESCRIPTION OF THE PREFERRED EMBODIMENTS

The accompanying drawing illustrates an example of equipment for depositing a silicon nitride film on a substrate through utilization of the photo-CVD technique.

The film depositing equipment is provided with a reaction chamber 1 made of quartz.

In the reaction chamber 1 there are disposed on the side of its bottom wall a heater 2 and a susceptor 3 on which a substrate 4 is placed.

An inlet 1a of the reaction chamber 1 at one side thereof has connected thereto via a stop valve 7 and a flow control valve 6 a gas source 5 for monosilane ($SiH_4$) or polysilane ($Si_nH_{2n+2}$, where $n \geq 2$) and via the stop valve 7 and a flow control valve 9 a gas source 8 for ammonia ($NH_3$) or hydrazine ($N_2H_4$). Further, the reaction chamber 1 has connected thereto via the stop valve 7 and a flow control valve 11 a carrier gas source 10 for a carrier gas C composed of an inert gas such as hydrogen, helium, argon or the like.

At an outlet 1b on the other side thereof the reaction chamber 1 has connected thereto an exhaustion vacuum pump 12 via a pressure control valve 13 and a step valve 14.

The top wall of the reaction chamber 1 has made therein a light-transparent window 15 formed of quartz. The inner surface of the window 15 is given a thin coating of transparent oil film 16 having a low vapor pressure for preventing the deposition thereon reaction products formed in the reaction chamber 1.

On the top of the top wall of the reaction chamber 1 is provided a lamp housing 17 which is constituted to include the top wall of the reaction chamber 1.

In the lamp housing 17 are disposed a low-pressure mercury lamp 18 and a reflector 19. Connected to the lamp housing 17 via a valve 22 is a vacuum pump 21 for exhaustion of the housing 17.

Next, a description will be given of examples of the present invention for the silicon nitride film deposition on the substrate through using the above-said equipment.

EXAMPLE 1

In the reaction chamber 1, the substrate 4 placed on the susceptor 3 is heated by the heater 2 up to 100 to 500° C. At the same time, the reaction chamber 1 is evacuated by the pump 12 through the valve 13 and 14. In this state the carrier gas C is introduced from the carrier gas source 10 via the valves 11 and 7 into the reaction chamber 1 to pass therein a constant stream of the carrier gas C.

On the other hand, the valve 22 is opened to evacuate the lamp housing 17 and the mercury lamp 18 is turned ON to emit ultraviolet light 20 into the reaction chamber 1. In this case, the ultraviolet light 20 has a wavelength 200 nm or less, preferably 185 nm, and an intensity of 0.01 to 5 W/cm$^2$ on the surface of the substrate 4.

Then the valves 6, 9 and 11 are opened to introduce a gas mixture ($SiH_4+NH_3$) of the monosilane gas from the gas source 5 and the ammonia gas from the gas source 8 into the reaction chamber 1, along with the carrier gas C.

In my experiment, the valves 6 and 9 were controlled to make the volume ratio between the monosilane gas and the ammonia gas $\frac{1}{8}$ or lower, and the valves 11 and 13 were controlled to hold the pressure in the reaction chamber 1 at 0.1 to 10 Torr.

In such a case, a film silicon nitride expressed by $Si_3N_{4-x}$ (where $0 \leq X < 4$) could be deposited on the substrate 4.

In the case where the substrate 4 was a silicon substrate, the temperature of the substrate 4 was 300° C., the pressure in the reaction chamber 1 was 0.1 Torr, the intensity of the ultraviolet light was 1 W/cm$^2$ and the ratio of the monosilane and the ammonia of the gas mixture ($SiH_4+NH_3$) was 1/10, a silicon nitride film of a composition close to the $Si_3N_4$ could be deposited at a rate of 0.2 Å/sec.

Moreover, when the abovesaid parameters were held unchanged except that the pressure in the reaction chamber 1 was selected to be 1 Torr, a silicon nitride film of a composition close to the $Si_3N_4$ could be deposited at a rate of 2 Å.

Further, when only the pressure in the reaction chamber 1 was changed to 2 Torr, a silicon nitride film of a composition close to the $Si_3N_4$ could be deposited at a rate of 2.3 Å.

Such a silicon nitride film was deposited 1000 Å thick on the substrate 4 of silicon by the above-described method and a conductor layer of aluminum was formed by sputtering on the silicon nitride film to obtain an MIS structure. Then electrical properties of the silicon nitride film were evaluated by measuring the capacitance-voltage and the current-voltage characteristic of the MIS structure. The observed vapacitance-voltage characteristic indicated that the silicon nitride had a charge density of $1 \times 10^{11}$ cm$^{-2}$ or less, and the current-voltage characteristic indicated that the film had a breakdown field strength of $3 \times 10^{16}$ V/cm or more. Accordingly, it has been confirmed that the silicon nitride film of the present invention is excellent as a dielectric film or insulating film.

EXAMPLE 2

The conditions used were the same as those in Example 1 except that a gas mixture ($SiH_4+N_2H_4$) of the monosilane gas from the gas source 5 and the hydrazine gas from the gas source 8 was supplied to the reaction chamber 1 instead of the gas mixture of the monosilane gas from the gas source 5 and the ammonia gas from the gas source 8. The volume ratio between the monosilane and the hydrazine gas was the same as in Example 1.

Also in this Example, an excellent silicon nitride film could be deposited on the substrate as in the case of Example 1.

EXAMPLE 3

The conditions used were the same as those in Example 1 except that a gas mixture ($Si_2H_6+NH_3$) of the polysilane gas from the gas source 5 and the ammonia gas from the gas source 8 was introduced into the reaction chamber 1 instead of the mixture gas of the monosilane gas from the gas source 5 and the ammonia gas form the gas source 8 and that the ultraviolet light 20 from the mercury lamp 18 had a wavelength of 300 nm or less, preferably 254 nm, instead of 185 nm. Further, the volume ratio between the polysilane and the ammonia gas was the same as in Example 1.

Also in this case, an excellent silicon nitride film could be deposited on the substrate.

EXAMPLE 4

The conditions used were the same as those in Example 1 except that a gas mixture ($Si_2H_6+N_2H_4$) of the polysilane gas from the gas source 5 and the hydrazin gas from the gas source 8 was introduced into the reaction chamber 1 instead of the mixture gas of the monosilane gas from the gas source 5 and the ammonia gas from the gas source 8 and that the ultraviolet light 20 from the mercury lamp 18 had a wavelength of 300 nm or less, preferably 254 nm, instead of 185 nm. Further, the volume ratio between the polysilane and the ammonia gas was the same as in Example 1.

Also in this case, an excellent silicon nitride film could be deposited on the substrate.

It will be apparent that many modifications and variations may be effected without departing from the scope of the novel concepts of the present invention.

What is claimed is:

1. A photo-chemical vapor deposition which includes the step of irradiating a source gas by light to deposit the silicon nitride ($Si_3N_4$) film on a substrate, characterized in that a gas mixture of monosilane ($SiH_4$) gas and ammonia ($NH_3$) or hydrazine ($N_2H_4$) gas but without mercury vapor is used as the source gas, that ultraviolet light having a wavelength of 200 nm or less is used as the light, that the reaction chamber is held under a pressure of 0.1 to 10 Torr, and that the substrate is held at 100–500° C., whereby the silicon nitride film is deposited with a charge density of $1 \times 10^{11}$ cm$^{-2}$ or less.

2. A photo-chemical vapor deposition of silicon nitride film according to claim 1, wherein the light is 185 nm ultraviolet light from a mercury lamp.

3. A photo-chemical vapor deposition of silicon nitride film according to claim 1, wherein the volume ratio between the monosilane gas and the ammonia or the hydrazine gas is ⅓ or lower.

4. A photo-chemical vapor deposition which includes the step of irradiating a source gas by light to deposit the silicon nitride ($Si_3N_4$) film on a substrate, characterized in that a gas mixture of polysilane (expressed by $Si_nH_{2n+2}$) wherein $n \geq 2$) gas and ammonia ($NH_3$) or hydrazine ($N_2H_4$) gas but without mercury vapor is used as the source gas, that ultraviolet light having a wavelength of 300 nm or less is used as the light, that the reaction chamber is held under pressure of 0.1 to 10 Torr, and that the substrate is held at 100–500° C., whereby the silicon nitride film is deposited with a charge density of $1 \times 10^{11} cm^{-2}$ or less.

5. A photo-chemical vapor deposition of silicon nitride film according to claim 4, wherein the light is 254 nm ultraviolet light from a mercury lamp.

6. A photo-chemical vapor deposition of silicon nitride film according to claim 4, wherein the volume ratio between the polysilane gas and the ammonia gas or the hydrazine gas is ⅓ or lower.

7. A photo-chemical vapor deposition of silicon nitride film according to any one of claim 1 and 4 wherein the ultraviolet light has an intensity of 0.01 to 5 W/cm².

* * * * *